United States Patent
Hollingsworth et al.

(10) Patent No.: US 7,935,419 B1
(45) Date of Patent: May 3, 2011

(54) THICK-SHELL NANOCRYSTAL QUANTUM DOTS

(75) Inventors: Jennifer A. Hollingsworth, Los Alamos, NM (US); Yongfen Chen, Eugene, OR (US); Victor I. Klimov, Los Alamos, NM (US); Han Htoon, Los Alamos, NM (US); Javier Vela, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 23 days.

(21) Appl. No.: 12/322,813

(22) Filed: Feb. 6, 2009

Related U.S. Application Data

(60) Provisional application No. 61/065,077, filed on Feb. 7, 2008.

(51) Int. Cl.
*B32B 5/16* (2006.01)

(52) U.S. Cl. ........ 428/403; 428/402; 428/404; 428/405; 428/406; 428/407; 428/548; 428/551; 428/570

(58) Field of Classification Search .......... 428/402–407, 428/548, 551, 570
See application file for complete search history.

(56) References Cited

U.S. PATENT DOCUMENTS 6,322,901 B1 * 11/2001 Bawendi et al. .............. 428/548

OTHER PUBLICATIONS

Hines, M. A. et al. Synthesis and Characterization of Strongly Luminescing ZnS-capped CdSe nanocrystals. J. Phys. Chem. 1996, v. 100, pp. 468-471.
Heyes et al. Effect of the Shell on the Blinking Statistics of Core-Shell Quantum Dots : A Single Particle Fluorescence Study. Phys. Rev. B 75, p. 125431 (2007).
Xie et al. Synthesis and Characterization of Highly Luminescent CdSe-Core CdS/$Zn_{0.5}Cd_{0.5}$S/ZnS Multishell Nanocrystals. J. Am. Chem. Soc. (2005), v. 127, pp. 7480-7488.
Nirmal et al. Fluorescence Intermittency in Single Cadmium Selenide Nanocrystals. Nature, 1996, 383, pp. 802-804.
Jeong et al. Effect of the Thiol-Thiolate Equilibrium on the Photophysical Properties of Aqueous CdSe/ZnS Nanocrystal Quantum Dots. *J. Amer. Chem. Soc.*, 2005, 127, pp. 10126-10127.
Jeng, "Fluorescence Intermittency of Quantum Dots", Dec. 2004, pp. 1-10.
Stefani et al., "Quantification of Induced and Spontaneous Quantum-dot Luminescence Blinking", Physical Review B 72, 125304, (2005).

* cited by examiner

*Primary Examiner* — Leszek Kiliman
(74) *Attorney, Agent, or Firm* — Juliet A. Jones; Bruce H. Cottrell

(57) ABSTRACT

Colloidal nanocrystal quantum dots comprising an inner core having an average diameter of at least 1.5 nm and an outer shell, where said outer shell comprises multiple monolayers, wherein at least 30% of the quantum dots have an on-time fraction of 0.80 or greater under continuous excitation conditions for a period of time of at least 10 minutes.

46 Claims, 6 Drawing Sheets

(a)

(b)

THICK-SHELL NANOCRYSTAL QUANTUM DOTS

CROSS REFERENCE TO RELATED APPLICATION

This application claims priority to U.S. Provisional Patent Application 61/065,077 filed on Feb. 7, 2008, and incorporated herein in its entirety.

STATEMENT OF FEDERAL RIGHTS

The United States government has rights in this invention pursuant to Contract No. DE-AC52-06NA25396 between the United States Department of Energy and Los Alamos National Security, LLC for the operation of Los Alamos National Laboratory.

FIELD OF THE INVENTION

The present invention relates to thick-shell nanocrystal quantum dots that exhibit desirable characteristics unique to their thick-shell structure, such as significantly suppressed fluorescence intermittency, no photobleaching, stability in a variety of chemical environments, and multi-excitonic emission.

BACKGROUND OF THE INVENTION

Semiconductor nanocrystal quantum dots (NQDs) are desirable fluorophores based on their unique particle-size-tunable optical properties, i.e., efficient and broadband absorption and efficient and narrow-band emission. Further, compared to alternative fluorophores, such as organic dyes, NQDs are characterized by significantly enhanced photostabililty. Despite these desirable characteristics, NQD optical properties may be frustratingly sensitive to their surface chemistry and chemical environment. For example, coordinating organic ligands are used to passivate the NQD surface during growth, and are retained following preparation. These coordinating ligands are strong contributors to bulk NQD optical properties such as quantum yields (QYs) in emission; however, the ligands tend to be labile and can become uncoordinated from the NQD surface, and can be damaged by exposure to the light sources used for NQD photoexcitation. Ligand loss through physical separation or photochemistry results in uncontrolled changes in QYs and, in the case of irreversible and complete loss, in permanent "darkening" or photobleaching. In addition, some ligands may be incompatible with certain solvents and systems, thus limiting the uses of a particular NQD.

Furthermore, NQDs are characterized by significant fluorescence intermittency, or "blinking," at the single NQD level. Without wishing to be limited by theory, blinking is generally considered to arise from an NQD charging process in which an electron (or a hole) is temporarily lost to the surrounding matrix (for example, via Auger ejection or charge tunneling) or captured to surface-related trap states. NQD emission turns "off" when the NQD is charged and turns "on" again when NQD charge neutrality is regained. Blinking is unacceptable for such potential NQD applications as single-photon light sources for quantum informatics and biolabels for real-time monitoring of single biomolecules. Previous attempts to address blinking include the use of charge mediators such as short-chain thiols on the NQD surface. This approach provided at best only a partial, short-term solution however, and encountered such problems as dependence on pH, concentration, lighting conditions, and the NQDs were further incompatible with a number of applications.

It is known that addition of an inorganic shell of a semiconductor material having a higher bandgap can generally enhance QYs and improve stability. See, for example, Hines, M. A.; Guyot-Sionnest, P. $J. Phys. Chem.$ 1996, v. 100, pp. 468-471. However, the optical properties of previously disclosed core/shell and core/multishell NQDs remain susceptible to blinking, photobleaching and ligand issues. A need exists, therefore, for NQDs which have increased stability, and decreased fluorescence intermittency and photobleaching.

SUMMARY OF THE INVENTION

The present invention meets the aforementioned needs by providing a NQD wherein key optical properties such as photobleaching, blinking, and multiexciton emission may be appreciably altered in comparison with conventional NQDs. Further, these properties, as well as ensemble NQD quantum yields in emission, are rendered independent of NQD surface chemistry and the chemical environment. These novel NQDs are made possible by the presence of multiple monolayers of an inorganic shell, which results in NQDs having a significantly thicker shell than those previously disclosed, and, in some embodiments of the invention, altered electronic structure from that of the starting core NQD or thinner-shell core/shell NQDs. For example, Type-I electronic structure becomes quasi-Type-II electronic structure (e.g., especially single-composition shell thick-shell NQDs) or step-function electronic structure becomes a gradient-potential electronic structure (e.g., especially alloyed shell thick-shell NQD). NQDs have been previously reported having up to seven monolayers of a specific composition (see, e.g., Heyes et al., Phys. Rev. B 75, pp. 125431 (2007)). NQDs having a higher number of monolayers were not reported, as no correlation was observed between shell thickness and quality indicators such as blinking. In other words, NQDs having up to seven monolayers showed no significant improvement, and thus there was no indication that an even higher number of monolayers would be beneficial. Applicants have found, however, that when the number of monolayers (and thus shell thickness) is at least seven monolayers, and the monolayers comprise a suitable material, an unexpected and non-linear effect on blinking and photobleaching is observed. These effects also may be observed in NQDs having fewer than seven monolayers when appropriate combinations of core and monolayer material are selected. In addition, NQDs having a thicker shell comprised of monolayers exhibit a surprising ligand-independence, which in turn leads to a number of desirable properties. These results have opened up an entirely new class of NQDs with previously unattainable properties.

The following describe some non-limiting embodiments of the present invention.

According to one embodiment of the present invention, colloidal nanocrystal quantum dots are provided comprising an inner core having an average diameter of at least 1.5 nm and an outer shell, wherein the outer shell comprises at least seven monolayers of an inorganic material and at least one of said monolayers comprises CdS.

According to another embodiment of the present invention, colloidal nanocrystal quantum dots are provided, comprising an inner core having an average diameter of at least 1.5 nm and an outer shell, wherein the outer shell comprises at least seven monolayers of an inorganic material, and wherein the inner core comprises a material selected from the group consisting of GaP, GaAs, GaSb, InP, InAs, InSb, ZnS, ZnSe, ZnTe, CdS, CdTe, PbS, PbSe, PbTe, and combinations thereof.

According to yet another embodiment of the present invention, colloidal nanocrystal quantum dots are provided, comprising an inner core having an average diameter of at least 1.5 nm and an outer shell, said outer shell comprised of monolayers, wherein at least 30% of the quantum dots have an on-time fraction of 80% or greater for a period of time of at least 10 minutes.

According to yet another embodiment of the present invention, colloidal nanocrystal quantum dots are provided, comprising an inner core having an average diameter of at least 1.5 nm and an outer shell, wherein the inner core comprises CdSe and wherein the outer shell is comprised of from seven to about twenty monolayers of CdS.

According to yet another embodiment of the present invention, colloidal nanocrystal quantum dots are provided, having an average diameter of at least 1.5 nm, and comprising an inner core and an outer shell, wherein the inner core comprises CdSe and wherein the outer shell is an alloyed shell comprising from seven to about twenty monolayers comprising ZnS, CdS, or combinations thereof.

BRIEF DESCRIPTION OF THE DRAWINGS

FIGS. 3b, 3d, 3f and 3h show data gathered from a single NQD, with intensity in arbitrary units (A.U.) on the y-axis vs. time in minutes on the x-axis. FIGS. 3a, 3c, 3d and 3g show data gathered from a plurality of NQDs, with intensity in arbitrary units on the y-axis vs. time in minutes on the x-axis.

DETAILED DESCRIPTION OF THE INVENTION

Figure 1:
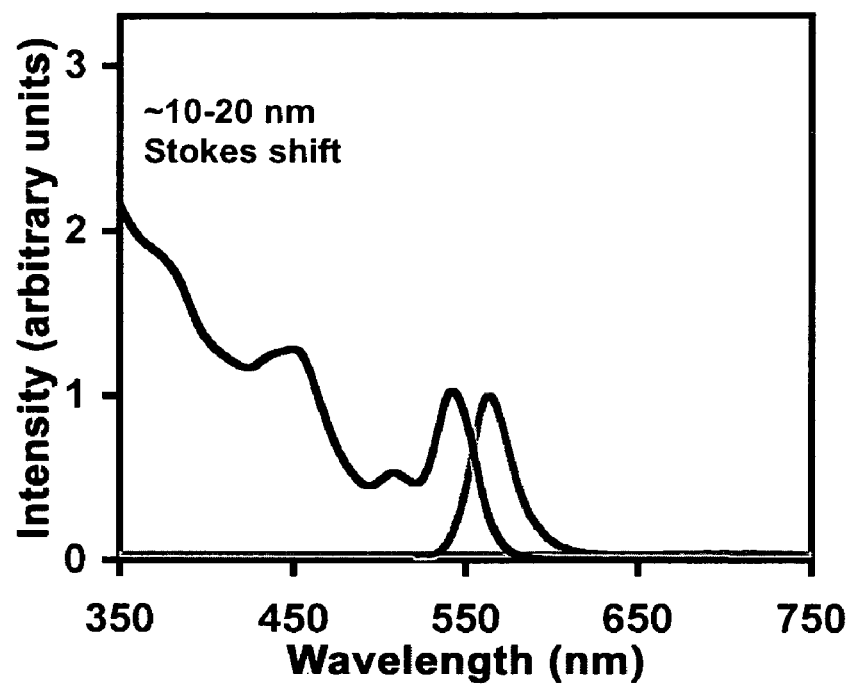
FIG. 1 shows the difference in the effective Stokes shift exhibited by the NQDs of the present invention (b) as compared to traditional, smaller NQDs (a), as a function of signal intensity vs. wavelength.
Figure 1:
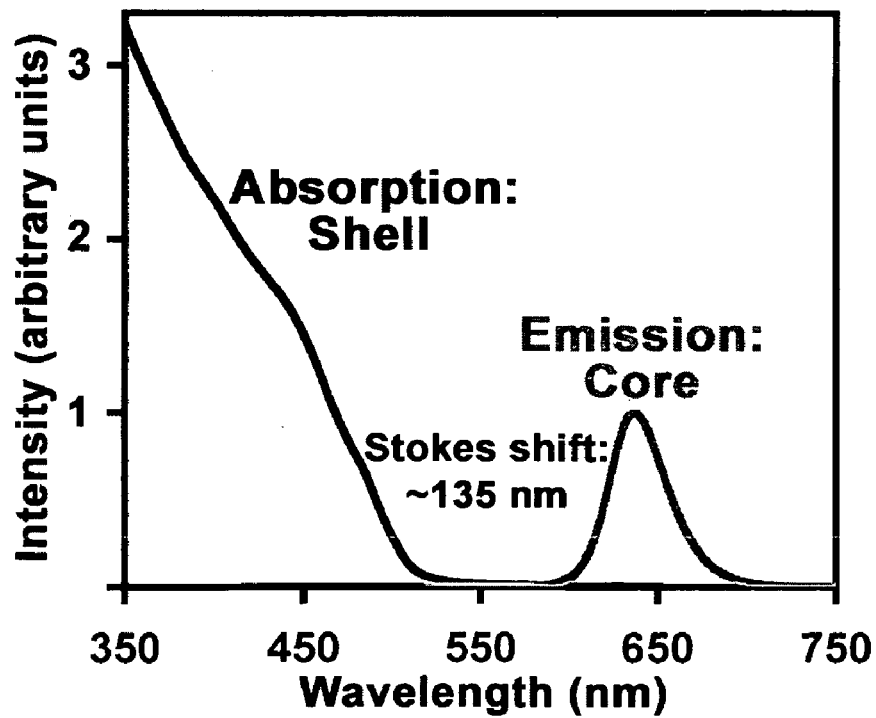
Figure 2:
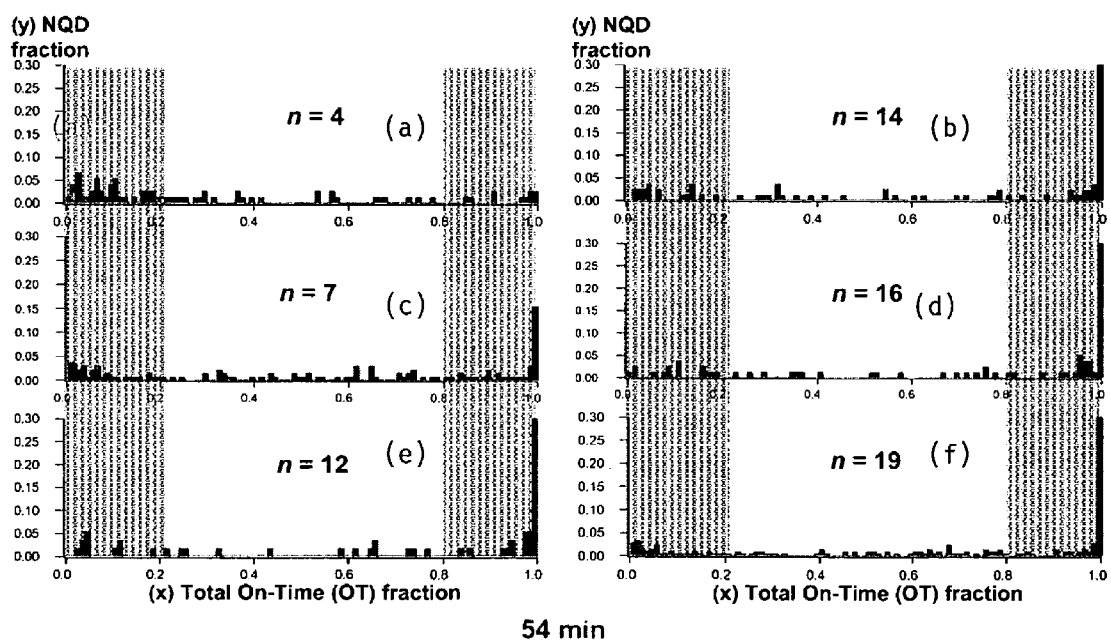
FIGS. 2(a)-(f) depicts the on-time fractions of NQDs having four monolayers (a, control) as compared to the NQDs of the present invention having seven (b), twelve (c), fourteen (d), sixteen (e) and nineteen (f) monolayers, as indicated by the fraction of NQDs on the x-axis which have a given on-time fraction (y-axis).

The present invention describes NQDs having at least seven monolayers of inorganic material surrounding a core, and are described in Chen et al., "'Giant' Multishell CdSe Nanocrystal quantum Dots with Suppressed Blinking," J. Am. Chem. Soc., vol. 130, issue 15, (2008) pp. 5026-5027, incorporated herein together with supporting information and experimental details in its entirety. The NQDs of the present invention show significantly suppressed blinking on-time scales ranging from 1 ms to at least 50 minutes, and are highly photostable. The NQDs of the present invention are ligand-independent, are unaffected by ligand exchange or solvent effects and further exhibit multi-excitonic emission. Without wishing to be limited by theory, it is believed that the unique properties of the NQDs of the present invention result from the fact that the wavefunction of the NQD core is fully isolated from the NQD surface and surface environment.

In all embodiments of the present invention, all percentages are by weight of the total composition, unless specifically stated otherwise. All ratios are weight ratios, unless specifically stated otherwise. All ranges are inclusive and combinable. All numerical amounts are understood to be modified by the word "about" unless otherwise specifically indicated.

As used herein, "nanocrystal quantum dot," or NQD, may be used interchangeably with the terms "quantum dot," "nanocrystal," "semiconductor quantum dot," and other similar terms that would be familiar to one of skill in the art.

"Monolayer," as used herein, means an amount of material deposited onto the core or onto previously deposited monolayers, that results from a single act of deposition of the shell material. The exact thickness of a monolayer is dependent upon the material. By way of example only, a CdS monolayer would have a thickness of about 0.35 nm.

"Fluorescence intermittency," also known as "blinking," as used herein means that a NQD exhibits one or more periods of time in which fluorescence emission ceases and/or is interrupted.

"On-time fraction," as used herein, means the fraction of total observation-time during continuous excitation that a single-NQD is exhibiting fluorescence emission, or is "on," where "continuous excitation" means essentially uninterrupted excitation by a suitable excitation source, one non-limiting example of which is a 532 nm, 205 mW continuous wave laser.

"Photobleaching," as used herein, means that in one or more NQDs fluorescence ceases, which results in irreversible darkening.

"Effective Stokes shift," as used herein, means the spectral separation between the primary, dominant absorption onset (i.e., that of the shell) and the photoluminescence maximum (i.e., that of the core).

"Ligand-independent," or other grammatical variations thereof, as used in the present invention means that the properties of the NQDs described herein are substantially unaffected by the presence or absence of ligands, or the identity of the ligands.

The colloidal nanocrystal quantum dots of the present invention comprise an inner core and an outer shell. The outer shell comprises an inorganic material, and in one embodiment may consist essentially of an inorganic material. The shape of the colloidal nanocrystal quantum dots may be a sphere, a rod, a disk, and combinations thereof, and with or without faceting. In one embodiment, the colloidal nanocrystal quantum dots include a core of a binary semiconductor material, e.g., a core of the formula MX, where M can be cadmium, zinc, mercury, aluminum, lead, tin, gallium, indium, thallium, magnesium, calcium, strontium, barium, copper, and mixtures or alloys thereof and X is sulfur, selenium, tellurium, nitrogen, phosphorus, arsenic, antimony or mixtures thereof. In another embodiment, the colloidal nanocrystal quantum dots include a core of a ternary semiconductor material, e.g., a core of the formula $M_1M_2X$, where $M_1$ and $M_2$ can be cadmium, zinc, mercury, aluminum, lead, tin, gallium, indium, thallium, magnesium, calcium, strontium, barium, copper, and mixtures or alloys thereof and X is sulfur, selenium, tellurium, nitrogen, phosphorus, arsenic, antimony or mixtures thereof. In another embodiment, the core of the colloidal nanocrystal quantum dots comprises a quaternary semiconductor material, e.g., of the formula $M_1M_2M_3X$, where $M_1$, $M_2$ and $M_3$ can be cadmium, zinc, mercury, aluminum, lead, tin, gallium, indium, thallium, magnesium, calcium, strontium, barium, copper, and mixtures or alloys thereof and X is sulfur, selenium, tellurium, nitrogen, phosphorus, arsenic, antimony or mixtures thereof. In one embodiment, the core of the colloidal nanocrystal quantum dots comprises silicon or germanium. Non-limiting examples of suitable core materials include cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), aluminum nitride (AlN), aluminum sulfide (AlS), aluminum phosphide (AlP), aluminum arsenide (AlAs), aluminum antimonide (AlSb), lead sulfide (PbS), lead selenide (PbSe), lead telluride (PbTe), gallium arsenide (GaAs), gallium nitride (GaN), gallium phosphide (GaP), gallium antimonide (GaSb), indium arsenide (InAs), indium nitride (InN), indium phosphide (InP), indium antimonide (InSb), thallium arsenide (TlAs), thallium nitride (TlN), thallium phosphide (TlP), thallium antimonide (TlSb), zinc cadmium selenide (ZnCdSe), indium gallium nitride (InGaN), indium gallium arsenide (InGaAs), indium gallium phosphide (InGaP), aluminum indium nitride (AlInN), indium aluminum phosphide (InAlP), indium aluminum arsenide (InAlAs), aluminum gallium arsenide (AlGaAs), aluminum gallium phosphide (AlGaP), aluminum indium gallium arsenide (AlInGaAs), aluminum indium gallium nitride (AlInGaN) and the like, mixtures of such materials, or any other semiconductor or similar materials. In another embodiment, the colloidal nanocrystal quantum dots include a core of a metallic material such as gold (Au), silver (Ag), cobalt (Co), iron (Fe), nickel (Ni), copper (Cu), manganese (Mn), alloys thereof and alloy combinations. Preferably, the core material is selected from the group consisting of GaP, GaAs, GaSb, InP, InAs, InSb, ZnS, ZnSe, ZnTe, CdS, CdSe, CdTe, PbS, PbSe, PbTe, and combinations thereof, and even more preferably the core material is CdSe.

The NQDs of the present invention may comprise at least seven monolayers of inorganic material, which surround the core material and collectively form the outer shell. When the monolayers are comprised of the same material, the NQD is referred to as a thick-shell NQD. When the composition of the individual monolayers varies (but is consistent within the monolayer), the NQD is referred to as a thick multi-shell NQD. In one embodiment, the NQDs of the present invention comprise at least 7 monolayers, alternatively at least 10 monolayers, alternatively at least 12 monolayers, alternatively at least 14 monolayers, alternatively at least 16 monolayers, alternatively at least 19 monolayers, and alternatively comprise from 8 to about 20 monolayers of inorganic material.

In an alternative embodiment, the composition of the monolayers varies gradually, such that the innermost layer consists essentially of material A, and subsequent layers comprise materials A and B in a molar relationship $A_1B_{1-x}$, wherein the value of x decreases sequentially from 1 to 0 such that the outermost layer or layers consist essentially of material B. One non-limiting example of such a NQD has the structure $Cd_xZn_{1-x}S$, where CdS is material A and ZnS is material B, the inner monolayer consists essentially of CdS and the outer layer(s) consist essentially of ZnS. Such a construction is referred to herein as an "alloyed shell," and the resulting NQD is referred to as an alloyed NQD.

The outer shell may comprise some of the same materials as the core or entirely different materials than the core, and may comprise a semiconductor material. The outer shell may include materials selected from among Group II-VI compounds, Group II-V compounds, Group III-VI compounds, Group III-V compounds, Group IV-VI compounds, Group compounds, Group II-N-V compounds, and Group II-IV-VI compounds. Non-limiting examples of suitable overcoatings include cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), aluminum nitride (AlN), aluminum phosphide (AlP), aluminum arsenide (AlAs), aluminum antimonide (AlSb), gallium arsenide (GaAs); gallium nitride (GaN), gallium phosphide (GaP), gallium antimonide (GaSb), indium arsenide (InAs), indium nitride (InN), indium phosphide (InP), indium antimonide (InSb), thallium arsenide (TlAs), thallium nitride (TlN), thallium phosphide (TlP), thallium antimonide (TlSb), lead sulfide (PbS), lead selenide (PbSe), lead telluride (PbTe), zinc cadmium selenide (ZnCdSe), indium gallium nitride (InGaN), indium gallium arsenide (InGaAs), indium gallium phosphide (InGaP), aluminum indium nitride (AlInN), indium aluminum phosphide (InAlP), indium aluminum arsenide (InAlAs), aluminum gallium arsenide (AlGaAs), aluminum gallium phosphide (AlGaP), aluminum indium gallium arsenide (AlInGaAs), aluminum indium gallium nitride (AlInGaN) and mixtures of any of the above. Preferably, the inorganic material of the outer shell comprises CdS, ZnS, $Cd_xZn_{1-x}S$, or combinations thereof.

The number of monolayers will determine the thickness of the outer shell and the diameter of the NQDs. The thickness of the shell must be sufficient to substantially isolate the wavefunction of the NQD core from the NQD surface and surface environment. In one embodiment, the inner core of the NQDs of the present invention may have an average diameter of at least 1.5 nm, and alternatively from about 1.5 to about 30 nm.

The quantum yield for NQDs of the present invention is largely independent of chemical environment (e.g., in hexane or in water), and is understood to mean the fraction of the number of emitted photons relative to the number of incident photons.

The NQDs of the present invention exhibit an enhanced Stokes shift, as depicted in FIG. 1. Thus, the NQDs are characterized by photoluminescence (PL) spectra that are shifted to longer wavelengths (lower energies) compared to previously described NQD cores, and essentially no emission from the shell is observed. FIG. 1a depicts the Stokes shift of previously reported NQDs, whereas FIG. 1b depicts that of the NQDs of the present invention. The NQDs of the present invention exhibit an effective Stokes shift of at least 75 nm, alternatively of at least 100 nm, and alternatively at least 135 nm.

Figure 4:
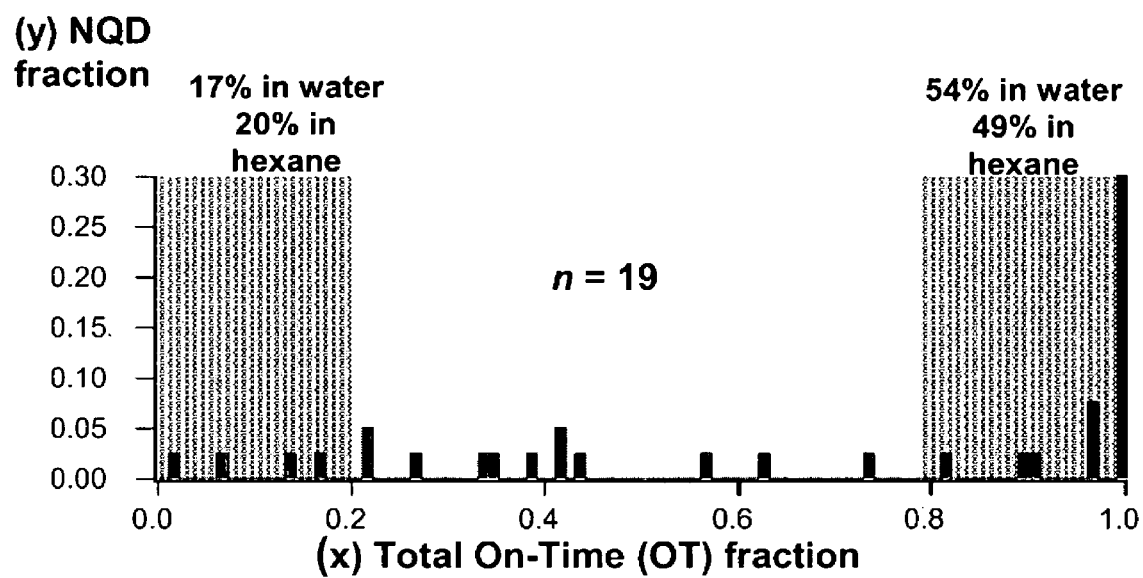
FIG. 4 shows the stability of the NQDs of the present invention in two different solvents, water and hexane, as evidenced by the lack of change (within experimental error) of blinking behavior, as indicated by the fraction of NQDs on the x-axis (in particular, 0.2 or less and 0.8 or above) which have a given on-time fraction (y-axis)

The NQDs of the present invention are ligand-independent, meaning that the exhibited properties remain substantially unchanged regardless of whether ligands are present, and regardless of the identity of the ligand. Some non-limiting examples of ligands include octadecylamine, trioctylphosphine oxide, and/or oleic acid with mercaptosuccinic acid. This ligand-independence provides a significant advantage, in that issues arising from ligand incompatibility with the surrounding environment may be avoided without sacrificing the desirable properties of the NQD. For example, if compatibility with a desired solvent is desired, a solvent-compatible ligand may be substituted. Similarly, if the presence of any ligand is deemed undesirable (for example, in biological systems where a ligand may provoke an immune response), the NQD may be made without ligands. As shown in FIG. 4, upon precipitation from growth solution (water) and re-dissolution in hexane, the on-time fractions for NQDs did not change significantly (17% vs. 20% at <0.2 and 54% vs. 49% at >0.8). Further, NQDs precipitated and re-dissolved 7 times and observed no changes in on-time fractions, nor was any significant change observed in on-time fractions upon transfer to water using a standard ligand exchange procedure (i.e., replacing original ligands that are present as a result of the NQD synthesis process, such as octadecylamine, trioctylphosphine oxide, and oleic acid with mercaptosuccinic acid).

Figure 5:
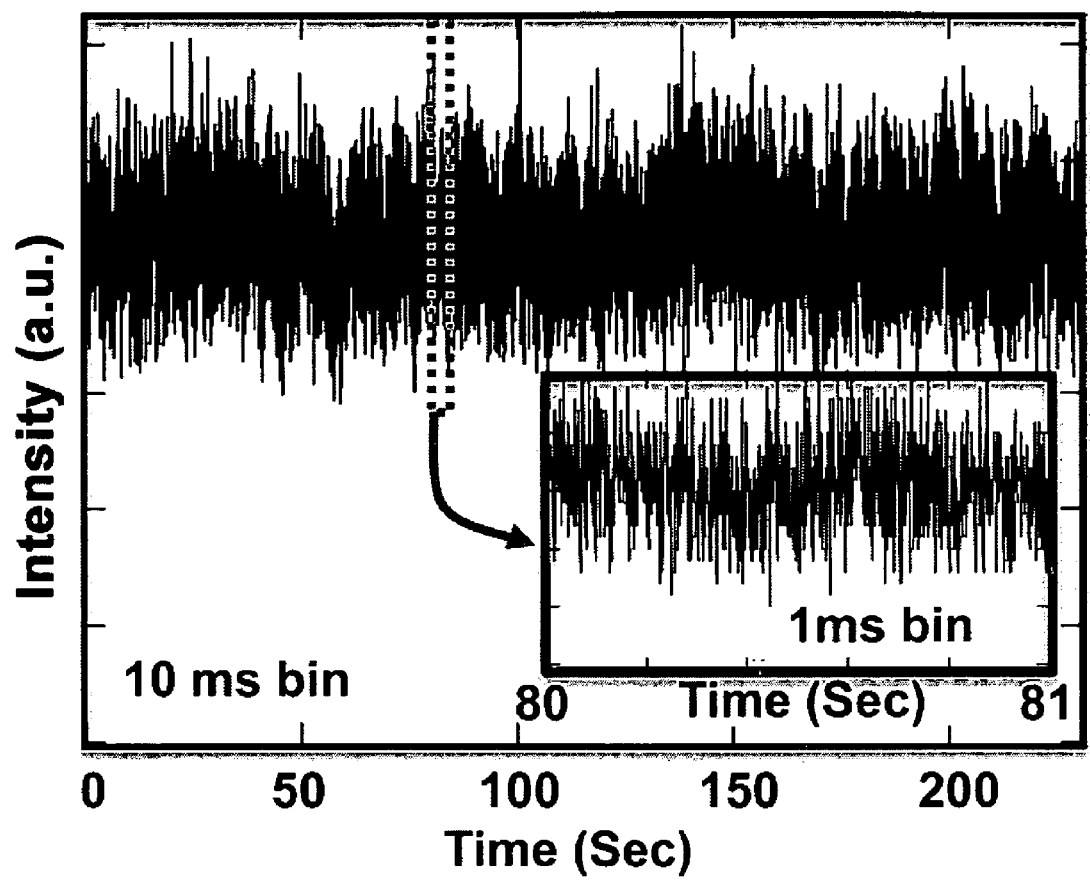
FIG. 5 shows blinking behavior of the NQDs of the present invention over a relatively short time interval of 200 ms, as measured by intensity in arbitrary units vs. time. No blinking (intensity=0) is observed.

Under continuous excitation conditions, significantly suppressed fluorescence intermittence, or blinking behavior, was observed for all NQDs of the present invention relative to control samples (See FIGS. 2a-f). The NQDs of the present invention are substantially free of both "fast" (about 1-10 ms temporal resolution) and "slow" (about 100-200 ms temporal resolution) blinking behavior. In one embodiment, the on-time fraction is independent of experimental time-resolution over a period of from about 1 ms to about 200 ms, meaning that when the quantum dots are viewed with increased resolution over this time period, the on-time fraction is still at least 0.99. The distinctive single-NQD fluorescence behavior and the blinking statistics for a large population of single (>500) the NQDs of the present invention and control having 4 monolayers is presented in FIG. 2. As is typical of traditional NQDs, >70% of the control NQDs have on-time fractions of <0.2 (left shaded area), and <5% are non-blinking (i.e., never turn off, at least 0.99 on the x-axis). In contrast, >15% of the NQDs of the present invention having at least 7 monolayers (FIG. 2(c)) are non-blinking and >30% of these NQDs have an on-time fraction of >0.8 (80%, right gray shaded areas). These fractions increase as the number of monolayers increases. For example, when the number of monolayers is at least 12, approximately 30% of the NQDs are non-blinking (FIG. 2(e)). FIG. 5 shows the absence of blinking behavior (as noted by the intensity not being equal to zero at anytime) over a shorter timescale, i.e. from about 1 ms to about 200 ms, with the inset showing the absence of blinking on a 1 ms timescale. Thus in one embodiment of the present invention, at least 30% of the NQDs have an on-time fraction of about 0.8 or greater, when measured over a period of at least 10 minutes, alternatively from about 5 minutes to about 15 minutes, and alternatively at least 50 minutes, and alternatively at least 1 hour. At least 15%, and alternatively at least 20%, and alternatively at least 30% of the NQDs of the present invention have an on-time fraction of about at least 0.99, when measured over a period of at least 10 minutes, alternatively of at least 50 minutes, and alternatively of at least 1 hour.

Figure 3:
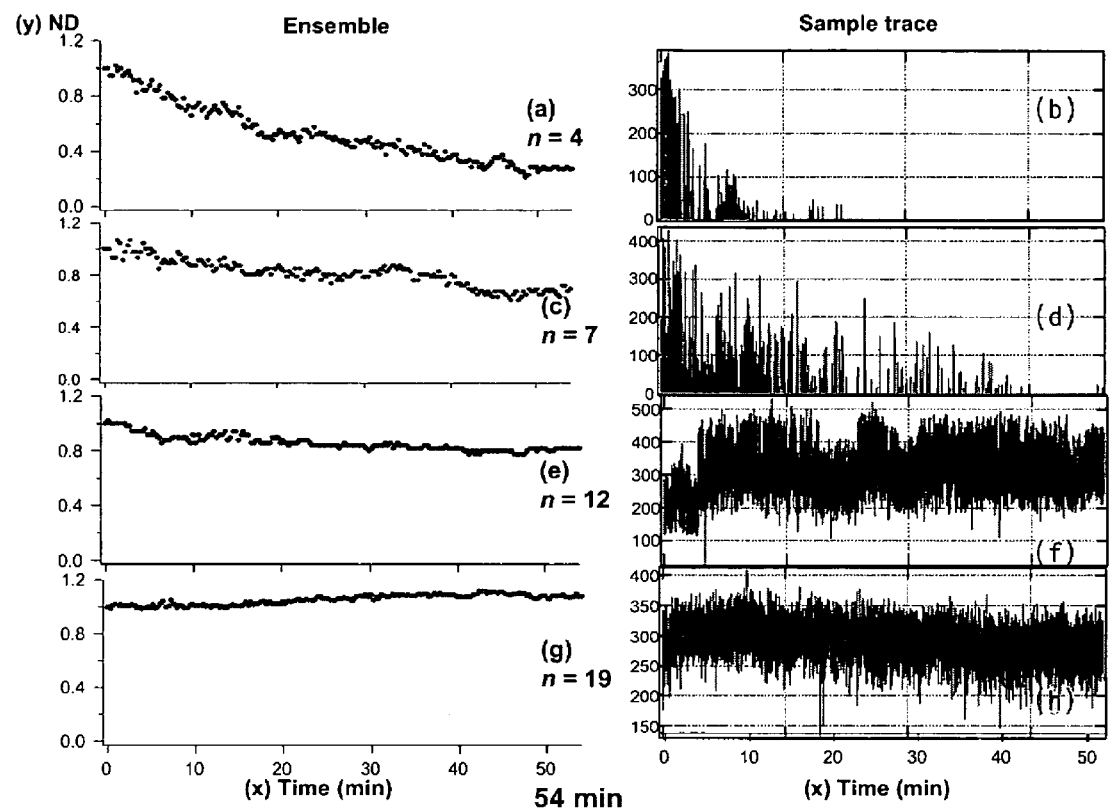
FIGS. 3(a)-(h) shows the stability of NQDs having four (3a and 3b, control), seven (3c and 3d), twelve (3e and 3f) and nineteen (3g and 3h) monolayers.

Also importantly, the NQDs of the present invention are stable under continuous laser illumination (532 nm, 205 mW laser) at a single dot level, where "stable" herein is understood to mean that an NQD does not exhibit photobleaching (i.e., permanently turning off). The time required for a NQD to exhibit photobleaching is an indicator of the stability of the NQD: the longer the time, the more stable the NQD. This is depicted in FIG. 3. Specifically, samples comprising four monolayers exhibited significant photobleaching (with complete absence of photoluminescence), with only just above 50% still stable after 10 minutes and approximately 30% stable after 1 hr. In contrast, about 90% of the NQDs of the present invention having seven monolayers were stable after 10 minutes, and after about 1 hour approximately 80% were still stable. When the number of monolayers is twelve or nineteen, substantially all of the NQDs are stable after 1 hour. Accordingly, in one embodiment about 80% of the NQDs of the present invention are stable for a period of at least one hour under continuous laser illumination as defined herein, and alternatively substantially all (100%) of the NQDs of the present invention are stable for a period of at least 1 hour. In another embodiment, about 90% of the NQDs of the present invention are stable for a period of at least ten minutes under continuous laser illumination as defined herein, and alternatively substantially all (100%) of the NQDs of the present invention are stable for a period of at least 10 minutes.

Figure 6:
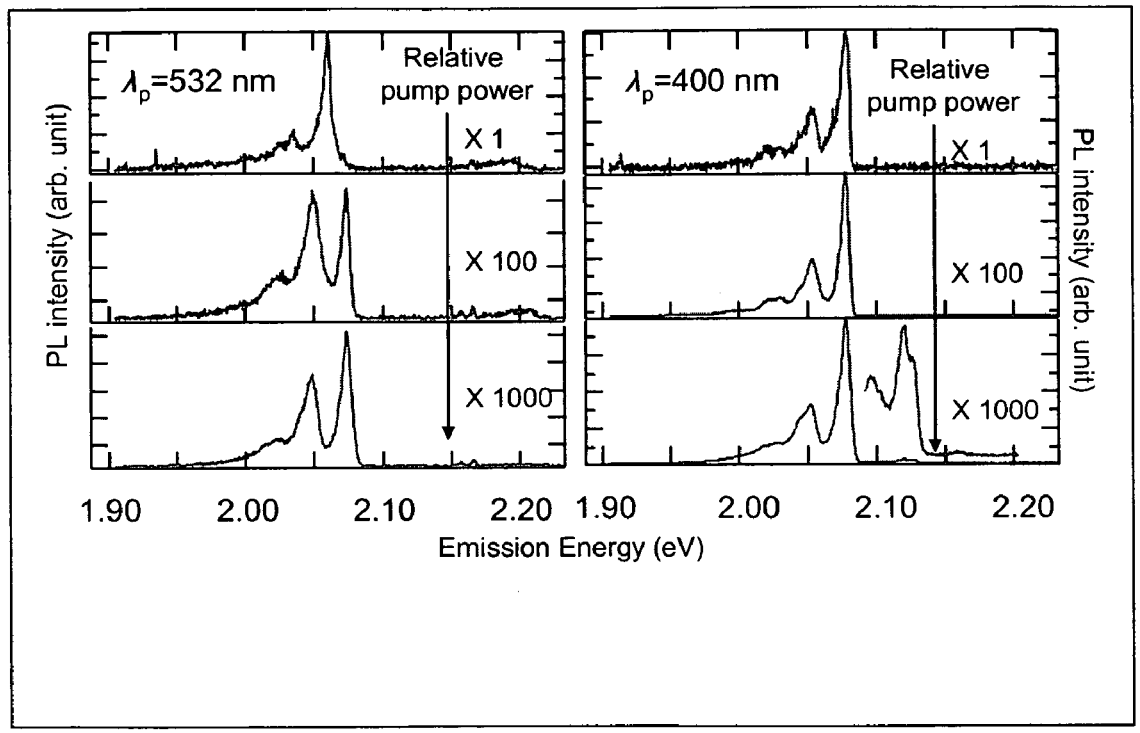
FIG. 6 shows multi-exciton emission of the NQDs of the present invention, where the pump power is for the left-hand figures has a maximum value of 40 kW/cm$^2$ and the pump power for the right-hand figures has a maximum value of 20 kW/cm$^2$, and increases from top to bottom. The y-axis represents intensity in arbitrary units and the y-axis represents emission energy in eV.

Unlike conventional NQDs, the NQDs of the present invention may exhibit multi-exciton emission when pumped with sufficiently high pump power (FIG. 6). In other words, the NQDs of the present invention are capable of emitting multiple photons of different energies simultaneously. As each energy is characteristic of a different emission color, the NQDs of the present invention emit more than one color of light simultaneously. The multiple emissions result from "multi-exciton states," such as bi-exciton states and tri-exciton states. In conventional NQDs, emission from any state other than a simple single exciton state is quenched due to an ultrafast non-radiative exciton recombination process, known as Auger recombination. Further, conventional NQDs also suffer from photodegradation at very high pump powers. FIG. 6 displays the emergence of new emission colors (peaks) at about 2.10-2.15 eV, in NQDs having 16 monolayers of CdS, with increasing pump power (the power increases with decreasing values of y on the y-axis). These emissions are made possible by the unique nanoscale architecture of the NQDs of the present invention, at energies higher than the energy of normal single exciton emission. In one embodiment, the multiexciton states of the quantum dots emit photons at a pump power of from about 400 $W/cm^2$ to about 40 $kW/cm^2$, and alternatively at a pump power of from about 400 $W/cm^2$ to about 20 $kW/cm^2$, wherein the pump is understood to be a 532 nm pump. Multi-exciton emission may occur at essentially any temperature, and in one embodiment occurs at 300K. In one embodiment, the NQDs of the present invention exhibit multiexciton states which emit two photons, and alternatively three photons, and alternatively at least three photons.

EXAMPLES

Synthetic Methods

Materials and instrumentation: Cadmium oxide, oleic acid. (90%), 1-octadecene (ODE, 90%), dioctylamine (95%), octadecylamine, zinc oxide, sulfur, selenium pellet, and trioctyl phosphine (TOP) were purchased from Aldrich and used without further purification. Trioctyl phosphine oxide (TOPO) (90%) was purchased from Strem Chemicals, Inc. (Newburyport, Mass.) and used without further purification. Absorption and emission spectra were recorded on a CARY™ UV-VIS-NIR spectrophotometer and a NanoLog™ fluorometer, respectively. TEM images were taken on a JEOL™ 2010 transmission electron microscope.

Example 1

Synthesis of CdSe-based "NQDs." The synthesis of giant CdSe/thick-shell NQDs was based on a SILAR approach with minor modification, as described in Xie et al., "Synthesis and Characterization of Highly Luminescent CdSe-Core CdS/Zn$_{0.5}$Cd$_{0.5}$S/ZnS Multishell Nanocrystals," J. Am. Chem. Soc. (2005), v. 127, pp. 7480-7488. The CdSe core was prepared by injection of 1 ml 1.5 M Se-TOP solution into a hot solution containing 1.5 g octadecylamine, 0.5 g TOPO, 5 g octadecene, and 0.2 mmol Cd-oleate under standard air-free conditions. After injection of Se-TOP at 290° C., the temperature was set at 250° C. for CdSe NQD growth. After ten minutes, the solution was cooled down to room temperature, and CdSe NQDs were collected by precipitation with acetone and centrifugation. CdSe core NQDs were re-dispersed in hexane.

About $1.5 \times 10^{-7}$ mol CdSe core NQDs in hexane were put into a 100 ml flask with 3 g ODE and 3 g dioctylamine. Instead of the primary amine used in the literature procedures, a secondary amine was chosen as the ligand to prevent the reaction between Cd-oleate and the amine ligands. 0.2 M elemental sulfur dissolved in ODE, 0.2 M Cd-oleate in ODE and 0.2 M Zn$_x$Cd$_{1-x}$-oleate (x=0.13, 0.49, 0.78, respectively) were used as precursors for shell growth. The quantity of precursors for each monolayer of shell was calculated according to the volume increment of each monolayer shell, considering the changing total NQD size with each successive monolayer grown. The reaction temperature was set at 240° C. Growth times were 1 h for sulfur and 3 h for the cation precursors. CdSe-based NQDs of different shell compositions were synthesized. For example, CdSe cores with 19 monolayers of CdS shell, CdSe cores with 11 monolayers of CdS shell plus 6 monolayers of Zn$_x$Cd$_{1-x}$S alloy shell and 2 monolayers of ZnS shell (19 monolayers of shell total), and CdSe cores with 10 monolayers of CdS shell plus 8 monolayers of ZnS shell (18 monolayers of shell total) were prepared. Other thinner shells, such as CdSe cores with 2 monolayers of CdS and 2 monolayers of ZnS shell, and CdSe cores with 2 monolayers CdS shell, 3 monolayers of Zn$_x$Cd$_{1-x}$S alloy shell and 2 monolayers of ZnS shell, were also prepared for control studies.

Example 2

Washing Experiment

To check the stability of NQDs with regard to purification, the NQDs of Example 1 were precipitated from growth solution and dispersed in hexane as described above. Further, they were subsequently subjected to multiple "purification" steps in which they were substantially completely precipitated with methanol followed by re-dispersion in hexane. This process was repeated up to seven times and without loss of solubility. QYs in emission were measured in growth solution, as well as after each precipitation/re-dispersion cycle. As controls, CdSe core NQDs and standard CdSe core/shell and core/multi-shell NQDs were similarly prepared, purified and measured for QY.

Example 3

Water-Soluble NQDs

CdSe NQDs were transferred into water by stirring purified nanocrystals ($\sim 5 \times 10^{-9}$ mol) in hexane with 1 mmol mercaptosuccinic acid in 5 ml deionized water overnight. Mercaptosuccinic acid was neutralized by tetramethylammonium hydroxide in water. The pH of the water was about 7.0. Mercaptosuccinic acid-capped NQDs were collected by centrifugation, and were then re-dispersed in a small amount of water and precipitated again using an excess of methanol to remove excess mercaptosuccinic acid. Finally, the purified mercatosuccinic acid-capped NQDs were dispersed in deionized water to form optically clear solutions.

Example 4

Quantum Yield Measurements

Quantum yields (QYs) for the NQDs and the various NQD control samples in hexane were measured by comparing the NQD emission with that of an organic dye (Rhodamine 590 in methanol). The excitation wavelength was 505 nm and emission was recorded from 520 nm -750 nm. The QY of Rhodamine 590 was taken to be 95%, and those for the NQD samples were calculated by comparing the emission peak areas of the NQDs with the known dye solution. Specifically, the NQD QYs were calculated using the formula:

$$QY_{NCs} = Abs_{dye}/Abs_{NCs} * \text{Peak area of NQDs/peak area of dye} * QY_{dye} * (RI_{dye}^2/RI_{NCs}^2)$$

$RI_{dye}$—refractive index of dye solution in methanol, =1.3284

$RI_{NCs}$—refractive index of CdSe nanocrystals solution in hexane, =1.3749

Typically, the absorbance of the dye and the CdSe NQD solutions were controlled between 0.01 and 0.05 optical density. The absorbance and emission for each sample were measured twice at two different concentrations. The reported NQD QYs comprise averages of the two measurements. In an effort to obtain more accurate results, at least five measurements were conducted at different concentrations.

Example 5

Dynamic Light Scattering

Hydrodynamic (total) diameters (HD's) were measured via Dynamic Light Scattering (DLS). DLS measurements were performed in 1 cm quartz cuvettes in a 90° angle configuration with a 633 nm laser source using a Palo Alto Nano-Zeta Sizer from Malvern™ Instruments. All DLS measurements are 12 run averages and were carried out at 20.0° C. after a 2 min. equilibration period. Viscosity and refractive index values for the solvent (toluene or hexane), and the refractive index for the semiconductor material were taken from the CRC Handbook of Chemistry and Physics, 81$^{st}$ Ed. (2000-2001). The refractive index for all NQDs was assumed to be similar to that reported for CdS. Unimodal HD distributions were obtained for all NQDs at different concentrations. HD values were corrected against polystyrene (PS) latex bead standards (Duke Scientific) in water in the 20-60 nm region (Table 1).

No evidence for aggregation or clustering of any of the NQD samples in solution was observed via DLS. Specifically, control experiments with mixtures of PS standards showed that DLS predominantly "sees" larger particles or aggregates: For example, a 5:5 mixture of 20 nm and 50 nm PS standards, respectively, gave an average or "effective" HD of 50.2 nm; whereas a 9:1 mixture of 20 nm and 50 nm PS standards, respectively, gave an average or "effective" HD of 39.5 nm. Thus, DLS is particularly sensitive in identifying even relatively small fractions of larger aggregates or clusters.

Further, the DLS results compare well to size analysis by TEM. According to TEM, the NQD CdSe/19CdS is 15.5+/−3.1 nm in size, and the NQD CdSe/11CdS/6Cd$_x$Zn$_y$S/2ZnS is 18.3+/−2.9 nm in size. After adding two ligand layers (about 3 nm considering presence of TOP and even longer oleylamine, etc.), the total diameters then range between 15.4 nm-21.6 nm for CdSe/19CdS and 18.4 nm-24.2 nm for CdSe/11CdS/6Cd$_x$Zn$_y$S/2ZnS. These results are consistent with that obtained by DLS (Table 2), and especially so considering that DLS sizes are inherently skewed towards the larger side of a size distribution (see above control study using mixtures of differently sized PS bead standards).

TABLE 1

Dynamic light scattering analysis of NQDs.

| Sample | HD (nm)[a] | PDI (%) | PDI (nm) |
|---|---|---|---|
| CdSe/11CdS/6Cd$_x$0Zn$_y$S/2ZnS | 25.1 | 9.5 | 2.4 |
| CdSe/11CdS/6Cd$_x$Zn$_y$S/2ZnS | 24.5[b] | 9.0 | 2.2 |
| CdSe/19CdS | 23.0 | 3.2 | 0.7 |

[a]FID = Hydrodynamic (total) diameter; measured in toluene or hexane after one or two precipitations with MeOH. HD values are corrected against polystyrene latex standards (20-60 nm).
[b]Unwashed: measured in growth solution.

TABLE 2

Comparison of TEM-derived total size with DLS-derived total size.

| sample | TEM total size (from histograms + 2 ligand layers) | DLS total size (HD) (from corrected HD's in Table 1 above) |
|---|---|---|
| giant alloy | 15.4-21.6 nm | 22.7-27.5 nm (washed) 22.3-26.7 nm (unwashed) |
| giant 19CdS | 18.4-24.2 nm | 22.3-23.7 nm |

Example 6

Single-Dot Blinking and Photostability Studies

Sample preparation: NQDs and control NQD samples (controls: Qdot® 655 ITK (Invitrogen™), CdSe/2CdS/2CdZnS/nZnS (n=2 or 3), and CdSe cores) were diluted in HPLC grade toluene or deionized water (in the case of carboxylate-thiol-exchanged dots) to a concentration of about 0.1-50 pM range. Thin films of these highly dilute solutions were made on new 0.5 mm thick quartz slides (pre-cleaned with chloroform, acetone, methanol and air-pressure).
Single-dot imaging: NQDs were excited by focusing a 532 nm CW laser (~100 mW) onto a spot of about 50 μm in diameter. PL of individual NQDs was collected through a 40×, 0.6NA microscope objective and imaged onto a liquid-nitrogen-cooled CCD detector. The images covered an area about 40×45 μm$^2$ in size and were acquired using a 100 ms integration-time. Series of up to 18,000 such images were acquired consecutively. Each image in the series was separated by ~100 ms of CCD read-out time. A computer program designed to extract the intensity fluctuations of all individual NQDs for these series of images was used to analyze blinking statistics. The distribution of on-time fractions (total on-time/total experiment time) displayed in the main text were extracted from ~500 NQDs. It is important to note that the PL intensity of individual NQDs varies widely. When the PL of a relatively weakly emitting NQD goes below a designated threshold, the program automatically counts this event as an "off" state. Therefore, this analysis program inherently underestimates the total % on-time.
Photobleaching analysis: To quantitatively analyze the photostability of our NQDs in comparison to the control samples, the total number was monitored of different NQDs observed in every 18 s time interval (extracted from 100 images taken consecutively) for 1080 s (corresponding to 6000 images).

All documents cited in the Detailed Description of the Invention are, in relevant part, incorporated herein by reference; the citation of any document is not to be construed as an admission that it is prior art with respect to the present invention. To the extent that any meaning or definition of a term in this document conflicts with any meaning or definition of the same term in a document incorporated by reference, the meaning or definition assigned to that term in this document shall govern.

Whereas particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. Colloidal nanocrystal quantum dots comprising an inner core having an average diameter of at least 1.5 nm and an outer shell, wherein the outer shell comprises at least seven monolayers of an inorganic material, wherein at least one of said monolayers comprises CdS, and wherein at least 30% of the quantum dots have an on-time fraction of at least 0.80 for a period of at least 10 minutes.

2. The colloidal nanocrystal quantum dots of claim 1, wherein the outer shell comprises from eight to about twenty monolayers of an inorganic material.

3. The colloidal nanocrystal quantum dots of claim 1, wherein the inner core consists essentially of CdSe.

4. The colloidal nanocrystal quantum dots of claim 1, wherein the outer shell is an alloyed shell comprising from seven to about twenty monolayers comprising ZnS, CdS, or combinations thereof.

5. The colloidal nanocrystal quantum dot of claim 1, wherein at least 30% of the quantum dots have an on-time fraction of at least 0.80 for a period of at least 50 minutes.

6. Colloidal nanocrystal quantum dots comprising an inner core having an average diameter of at least 1.5 nm and an outer shell, wherein the outer shell comprises at least seven monolayers of an inorganic material, wherein at least one of said monolayers comprises CdS, and wherein at least 80% of the quantum dots are stable for a period of at least 10 minutes.

7. The colloidal nanocrystal quantum dots of claim 1, wherein at least 80% of the quantum dots are stable for a period of at least 1 hour.

8. The colloidal nanocrystal quantum dots of claim 1, wherein the quantum dots exhibit multiexciton states which emit at least two photons at a pump power of from about 400 W/cm$^2$ to about 40 kW/cm$^2$.

9. The colloidal nanocrystal quantum dots of claim 1, wherein the quantum dots exhibit an effective Stokes shift of at least 75 nm.

10. The colloidal nanocrystal quantum dots of claim 1, wherein the quantum dots comprise one or more ligands.

11. The colloidal nanocrystal quantum dots of claim 1, wherein the quantum dots are substantially free from ligands.

12. Colloidal nanocrystal quantum dots comprising an inner core having an average diameter of at least 1.5 nm and an outer shell, wherein the outer shell comprises at least seven monolayers of an inorganic material, wherein the inner core comprises a material selected from the group consisting of GaP, GaAs, GaSb, InP, InAs, InSb, ZnS, ZnSe, ZnTe, CdS, CdTe, PbS, PbSe, PbTe, and combinations thereof and wherein at least 30% of the quantum dots have an on-time fraction of 0.80 or greater for a period of at least 10 minutes.

13. The colloidal nanocrystal quantum dots of claim 12, wherein the outer shell comprises from eight to about twenty monolayers of an inorganic material.

14. The colloidal nanocrystal quantum dots of claim 12, wherein the outer shell is an alloyed shell comprising from seven to about twenty monolayers comprising ZnS, CdS, or combinations thereof.

15. The colloidal nanocrystal quantum dot of claim 12, wherein at least 30% of the quantum dots have an on-time fraction of 0.80 or greater for a period of at least 50 minutes.

16. The colloidal nanocrystal quantum dots of claim 12, wherein at least 80% of the quantum dots are stable for a period of at least 10 minutes.

17. The colloidal nanocrystal quantum dots of claim 12, wherein at least 80% of the quantum dots are stable for a period of at least 1 hour.

18. The colloidal nanocrystal quantum dots of claim 12, wherein the quantum dots exhibit multiexciton states which emit at least two photons at a pump power of from about 400 W/cm$^2$ to about 40 kW/cm$^2$.

19. The colloidal nanocrystal quantum dots of claim 12, wherein the quantum dots exhibit an effective Stokes shift of at least 75 nm.

20. The colloidal nanocrystal quantum dots of claim 12, wherein the quantum dots comprise one or more ligands.

21. The colloidal nanocrystal quantum dots of claim 12, wherein the quantum dots are substantially free from ligands.

22. Colloidal nanocrystal quantum dots comprising an inner core having an average diameter of at least 1.5 nm and an outer shell, where said outer shell comprises multiple monolayers, wherein at least 30% of the quantum dots have an on-time fraction of 0.80 or greater under continuous excitation conditions for a period of time of at least 10 minutes.

23. The colloidal nanocrystal quantum dots of claim 22, wherein the period of time is at least 1 hour.

24. The colloidal nanocrystal quantum dots of claim 22, wherein at least 20% of the quantum dots have an on-time fraction of at least 0.99 for a period of time of at least 10 minutes.

25. The colloidal nanocrystal quantum dots of claim 22, wherein the quantum dots comprise one or more ligands.

26. The colloidal nanocrystal quantum dots of claim 22, wherein the quantum dots are substantially free from ligands.

27. The colloidal nanocrystal quantum dots of claim 22, wherein the quantum dots exhibit multiexciton states which emit at least two photons at a pump power of from about 400 W/cm$^2$ to about 40 kW/cm$^2$.

28. The colloidal nanocrystal quantum dots of claim 22, wherein the on-time fraction is independent of experimental time-resolution over a period of from about 1 ms to about 200 ms.

29. The colloidal nanocrystal quantum dots of claim 22, wherein at least 80% of the quantum dots are stable for a period of from about 1 ms to about 200 ms.

30. The colloidal nanocrystal quantum dots of claim 22, wherein at least 80% of the quantum dots are stable for a period of at least 10 minutes.

31. The colloidal nanocrystal quantum dots of claim 22, wherein at least 80% of the quantum dots are stable for a period of at least one hour.

32. The colloidal nanocrystal quantum dots of claim 22, wherein the quantum dots comprise an outer shell comprising from eight to about twenty monolayers of an inorganic material.

33. The colloidal nanocrystal quantum dots of claim 32, wherein the inorganic material is selected from the group consisting of CdS, ZnS and combinations thereof.

34. The colloidal nanocrystal quantum dots of claim 33, wherein the outer shell is alloyed.

35. The colloidal nanocrystal quantum dots of claim 22, wherein the quantum dots comprise an inner core comprising a material selected from the group consisting of GaP, GaAs, GaSb, InP, InAs, InSb, ZnS, ZnSe, ZnTe, CdS, CdSe, CdTe, PbS, PbSe, PbTe, and combinations thereof.

36. The colloidal nanocrystal quantum dots of claim 22, wherein the quantum dots exhibit an effective Stokes shift of at least 75 nm.

37. Colloidal nanocrystal quantum dots comprising an inner core having an average diameter of at least 1.5 nm and an outer shell, wherein the inner core comprises CdSe, wherein the outer shell is comprised of from seven to about twenty monolayers of CdS, and wherein at least 15% of the quantum dots have an on-time fraction of at least 0.99 for a period of time of at least 10 minutes.

38. The colloidal nanocrystal quantum dots of claim 37, wherein the quantum dots comprise at least twelve monolayers and at least 20% of the quantum dots have an on-time fraction of at least 0.99 for a period of time of at least 10 minutes.

39. The colloidal nanocrystal quantum dots of claim 37, wherein the quantum dots comprise at least fourteen monolayers and at least 30% of the quantum dots have an on-time fraction of at least 0.99 for a period of time of at least 10 minutes.

40. The colloidal nanocrystal quantum dots of claim 37, wherein the quantum dots comprise at least seven monolayers and wherein the quantum dots are stable for a period of time of from about 1 ms to about 200 ms.

41. The colloidal nanocrystal quantum dots of claim 37, wherein the quantum dots comprise at least seven monolayers and at least 90% of the quantum dots are stable for a period of at least 10 minutes.

42. The colloidal nanocrystal quantum dots of claim 37, wherein the quantum dots comprise at least seven monolayers and at least 80% of the quantum dots are stable for a period of at least one hour.

43. The colloidal nanocrystal quantum dots of claim 37, wherein the quantum dots comprise at least nineteen monolayers and at least 95% of the quantum dots are stable for a period of at least 10 minutes.

44. The colloidal nanocrystal quantum dots of claim 37, wherein the quantum dots comprise at least nineteen monolayers and at least 95% of the quantum dots are stable for a period of at least one hour.

45. The colloidal nanocrystal quantum dots of claim 37, wherein the quantum dots exhibit multiexciton states which emit at least two photons at a pump power of from about 400 W/cm$^2$ to about 40 kW/cm$^2$.

46. Colloidal nanocrystal quantum dots comprising an inner core having an average diameter of at least 1.5 nm and an outer shell, wherein the inner core comprises CdSe and wherein the outer shell is an alloyed shell comprising from seven to about twenty monolayers comprising ZnS, CdS, or combinations thereof.

* * * * *